(12) United States Patent
Honma

(10) Patent No.: US 6,221,730 B1
(45) Date of Patent: Apr. 24, 2001

(54) FABRICATION METHOD OF SEMICONDUCTOR DEVICE WITH HSG CONFIGURATION

(75) Inventor: Ichiro Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/243,300

(22) Filed: Feb. 2, 1999

(30) Foreign Application Priority Data

Feb. 3, 1998 (JP) .................................................. 10-022005

(51) Int. Cl.[7] .................................................. H01L 21/8242
(52) U.S. Cl. ........................ 438/398; 438/253; 438/255; 438/396
(58) Field of Search ................................ 438/255, 398, 438/396, 397, 253, 254

(56) References Cited

U.S. PATENT DOCUMENTS

| | | | |
|---|---|---|---|
| 5,696,014 | 12/1997 | Figura | 438/398 |
| 5,888,878 | * 3/1999 | Tsuchimoto et al. | 438/398 |

FOREIGN PATENT DOCUMENTS

| | | | |
|---|---|---|---|
| 61-144820 | 7/1986 | (JP) | H01L/21/22 |
| 01-291424 | 11/1989 | (JP) | H01L/21/225 |
| 05-304273 | 11/1993 | (JP) | H01L/27/108 |
| 08-264475 | 10/1996 | (JP) | H01L/21/225 |
| 08-298312 | 11/1996 | (JP) | H01L/27/108 |
| 09-232245 | 9/1997 | (JP) | H01L/21/255 |
| 09-237877 | 9/1997 | (JP) | H01L/27/108 |
| 09-246201 | 9/1997 | (JP) | H01L/21/225 |
| 10-022467 | 1/1998 | (JP) | H01L/27/108 |

* cited by examiner

*Primary Examiner*—Carl Whitehead, Jr.
*Assistant Examiner*—Toniae M. Thomas
(74) *Attorney, Agent, or Firm*—Hayes, Soloway, Hennessey, Grossman & Hage, PC

(57) ABSTRACT

A fabrication method of a semiconductor device is provided, which makes it possible to introduce suitably a dopant into surface grains of a semiconductor layer at a comparatively low temperature. In the first step, a first semiconductor layer is formed over a semiconductor substrate through a first dielectric. In the second step, the first semiconductor layer is heat-treated to form semiconductor grains on a surface of the first semiconductor layer, thereby roughening the surface of the first semiconductor layer. The grains are made of a same material as that of the first semiconductor layer. In the third step, the first semiconductor layer with the semiconductor grains is heat-treated at a temperature of approximately 700° C. to 780° C. for a specific time in an atmosphere containing a gaseous dopant, thereby introducing the dopant into the semiconductor grains of the first semiconductor layer from the atmosphere. Preferably, a step of forming a second dielectric layer is additionally provided between the second and third steps, where the second dielectric layer is not doped with any dopant. The dopant is introduced into the semiconductor grains of the first semiconductor layer through the second dielectric layer in the third step. Thereafter, a step of removing the second dielectric layer is provided after the third step.

11 Claims, 10 Drawing Sheets

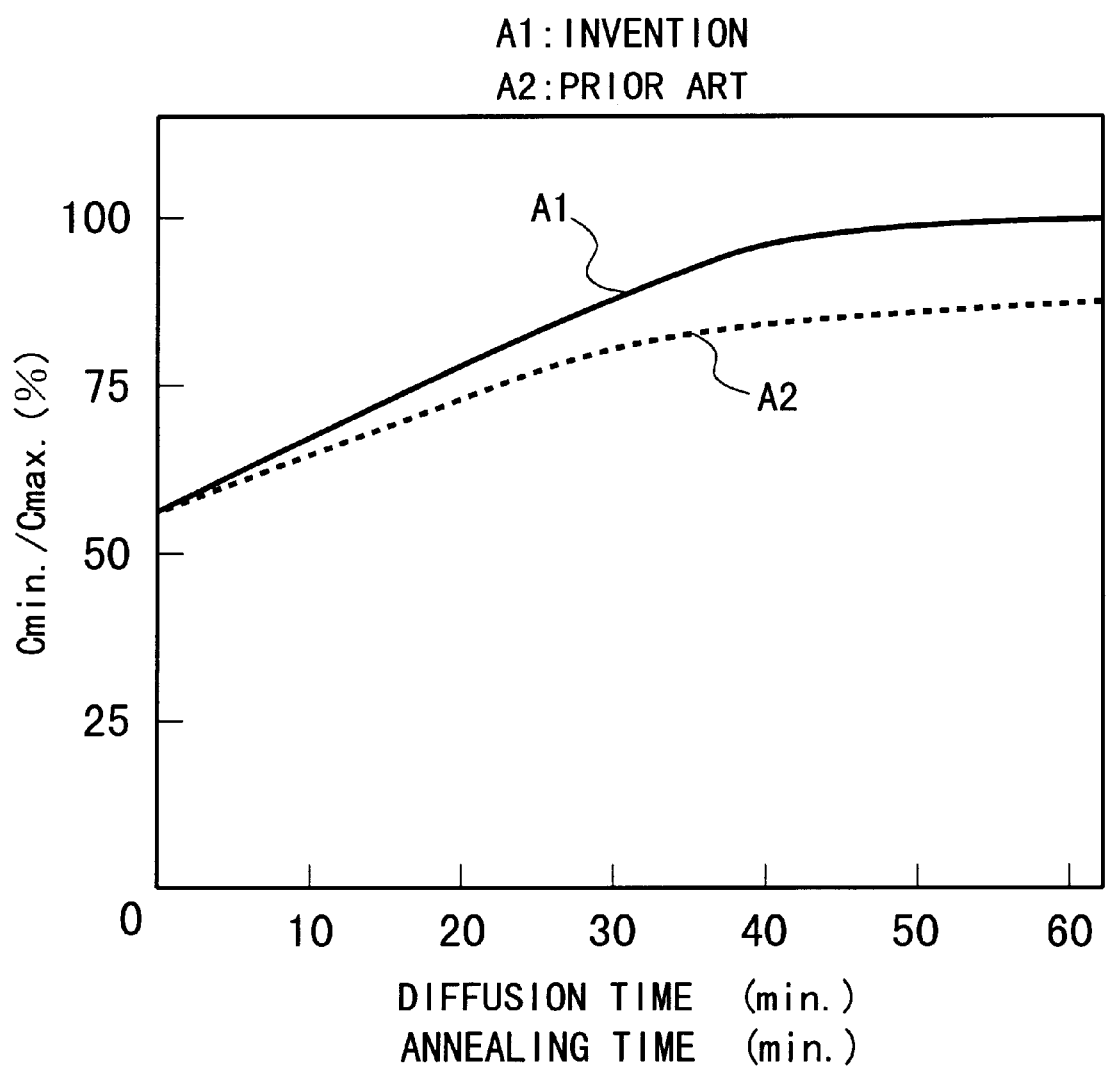

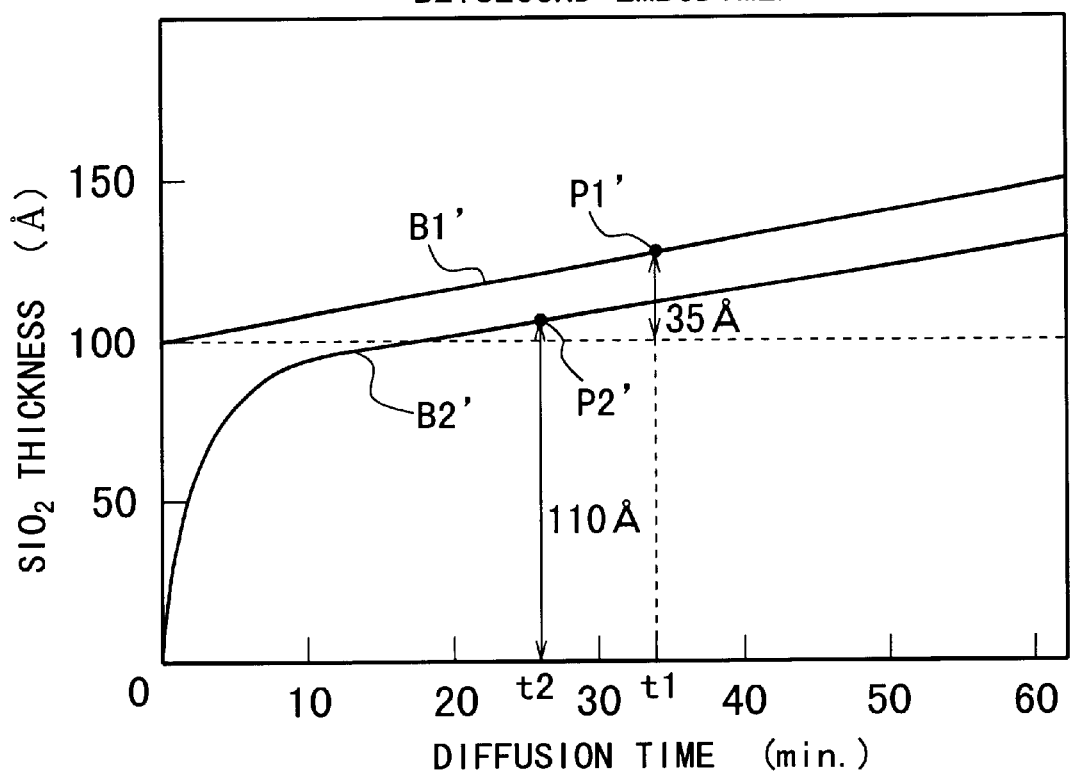

FABRICATION METHOD OF SEMICONDUCTOR DEVICE WITH HSG CONFIGURATION

BACKGROUND OF THE INVENTION

1. Field of the Invention

The present invention relates to a fabrication method of a semiconductor device and more particularly, to a fabrication method of a semiconductor device equipped with a semiconductor layer with a hemispherical-grained (HSG) configuration, which is preferably applied to fabrication of dynamic random-access memories (DRAMs) necessitating very large capacitance.

2. Description of the Prior Art

In recent years, to raise the integration level of electronic elements in DRAMs, there has been the strong need to increase the capacitance per chip area of memory cell capacitors. To cope with this need, the top or bottom electrode of each memory cell capacitor has been formed to have a solid or three-dimensional shape such as a cylinder.

Moreover, to increase the surface area of the bottom electrode, the use of a silicon (Si) layer with a HSG configuration (i.e., a HSG Si layer) has been studied to increase the surface irregularities of the bottom electrode, thereby roughening positively the surface of the bottom electrode. In this case, however, if the HSG Si layer is depleted during operation of the memory cell capacitor, the electric resistance of the HSG Si layer increases, which means that any satisfactory capacitance increase is unable to be realized. As a result, it has been usual that a suitable impurity or dopant such as phosphorus (P) is introduced into the HSG Si layer by a conventional diffusion or ion-implantation process, thereby lowering the electric resistance of the HSG Si layer.

Japanese Non-Examined Patent Publication No. 9-289292 published in November 1997 discloses fabrication methods of a semiconductor device equipped with a surface-roughened polysilicon layer similar to the HSG Si layer.

One of these prior-art methods thus disclosed is comprised of a first step of forming an interlayer dielectric layer on or over a semiconductor substrate, a second step of forming a contact hole in the interlayer dielectric layer to uncover the underlying substrate, a third step of forming a surface-roughened polysilicon (poly-Si) layer on the interlayer dielectric layer to cover the contact hole, a fourth step of forming a phosphosilicate glass (PSG) layer on the surface-roughened poly-Si layer, a fifth step of diffusing phosphorus (P) atoms contained in the PSG layer into the surface-roughened poly-Si layer as a dopant, and a six step of removing the PSG layer from the surface-roughened poly-Si layer.

In the fifth step, the diffusion of the P atoms into the surface-roughened poly-Si layer is carried out by a heat treatment process at a comparatively high temperature of approximately 800 to 950° C. for approximately 10 to 60 minutes.

Incidentally, to fabricate a DRAM incorporated with logic circuits, heat treatment processes are necessary to be carried out at a temperature as low as possible for a time as short as possible, thereby preventing the logic circuits (especially, transistors provided in the logic circuits) from being thermally damaged.

With the above-described prior-art fabrication method disclosed in Japanese Non-Examined Patent Publication No. 9-289292, however, the fifth step of diffusing the P atoms into the surface-roughened polysilicon layer is carried out at a high temperature of approximately 800° C. to 950° C. for a long time of approximately 10 to 60 minutes. Therefore, this prior-art method is unable to be applied to fabrication of the DRAM incorporated with the logic circuits.

Also, since the fifth step of diffusing the P atoms into the surface-roughened poly-Si layer is carried out at a high temperature of approximately 800° C. to 950° C. in the prior-art method, the Si atoms existing in the surface-roughened poly-Si layer are likely to be consumed during to the progress of the thermal oxidation of the PSG layer through the fifth step, resulting in a problem that the surface roughness of the surface-roughened poly-Si layer is decreased.

As described above, in fabrication of a DRAM incorporated with logic circuits, the protection of the logic circuits and the prevention of the surface-roughness decrease of the surface-roughened poly-Si layer are in a trade-off relationship with the suitable doping or introduction of the dopant into the surface-roughened poly-Si layer.

SUMMARY OF THE INVENTION

Accordingly, an object of the present invention to provide a fabrication method of a semiconductor device that makes it possible to introduce suitably a dopant into surface grains of a semiconductor layer at a comparatively low temperature.

Another object of the present invention to provide a fabrication method of a semiconductor device that makes it possible to introduce a dopant into a surface-roughened semiconductor layer while protecting logic circuits incorporated into a semiconductor memory device from applied heat.

Still another object of the present invention to provide a fabrication method of a semiconductor device that suppresses the surface roughness of a semiconductor layer with surface grains to be decreased in a heat-treatment process for introducing a dopant into the grains.

The above objects together with others not specifically mentioned will become clear to those skilled in the art from the following description.

A fabrication method of a semiconductor device according to the present invention is comprised of the following first to third steps.

In the first step, a first semiconductor layer is formed over a semiconductor substrate through a first dielectric.

In the second step, the first semiconductor layer is heat-treated to form semiconductor grains on a surface of the first semiconductor layer, thereby roughening the surface of the first semiconductor layer. The grains are made of a same material as that of the first semiconductor layer.

In the third step, the first semiconductor layer with the semiconductor grains is heat-treated at a temperature of approximately 700° C. to 780° C. for a specific time in an atmosphere containing a gaseous dopant, thereby introducing the dopant into the semiconductor grains of the first semiconductor layer from the atmosphere.

With the fabrication method of a semiconductor device according to the present invention, after the semiconductor grains are formed on the surface of the first semiconductor layer in the second step, the dopant is introduced into the semiconductor grains of the first semiconductor layer from the atmosphere containing the gaseous dopant in the third step. This is unlike the previously-described prior-art method in which the dopant is introduced into the surface-roughened semiconductor layer from the adjacent PSG layer.

Therefore, although the third step is carried out at a comparatively low temperature of approximately 700° C. to 780° C., the dopant can be suitably doped into the surface grains of the first semiconductor layer as desired.

Moreover, since the third step is carried out at a comparatively low temperature of approximately 700° C. to 780° C., the dopant can be introduced into the surface-roughened first semiconductor layer while protecting logic circuits incorporated into the semiconductor memory device from the heat applied in the third step.

The reason why the third step is carried out at a temperature of approximately 700° C. to 780° C. is as follows.

If the temperature is lower than 700° C., the necessary time for the heat-treatment process needs to be excessively long to realize a desired dopant concentration of the semiconductor grains, which is unable or difficult to be practically used. If the temperature is higher than 780° C., the electronic elements such as transistors incorporated into the semiconductor memory device are likely to be badly affected by the heat applied in the third step. For example, the withstand voltage and/or mutual conductance characteristics of the incorporated transistors are degraded due to profile deviation of the semiconductor regions or the like.

In a preferred embodiment of the method according to the present invention, the specific time in the third step is approximately 10 minutes to 120 minutes. If the time is shorter than 10 minutes, the advantages of the present invention are not obtained. On the other hand, even if the time is longer than 120 minutes, the advantages of the present invention are not enhanced.

In another preferred embodiment of the method according to the present invention, a step of forming a second dielectric layer is additionally provided between the second and third steps. The second dielectric layer is not doped with any dopant. The dopant is introduced into the semiconductor grains of the first semiconductor layer through the second dielectric layer in the third step. Thereafter, a step of removing the second dielectric layer is provided after the third step.

In this embodiment, because the first semiconductor layer with the semiconductor grains is suppressed to be thermally oxidized in the third step due to existence of the second dielectric layer, there is an additional advantage that the surface-roughness decrease of the first semiconductor layer with the surface grains is suppressed in the third step (i.e., the heat-treatment process for introducing the dopant into the grains).

Also, unlike the previously-explained prior-art method, the dopant is introduced from the atmosphere in the third step. Therefore, there is another additional advantage that the second dielectric layer may be formed as thin as possible and as a result, the second dielectric layer is readily removed.

It is preferred that the second dielectric layer has a thickness of approximately 5 nm to 20 nm. If the thickness of the second dielectric layer is smaller than approximately 5 nm, the effect to suppress the oxidation of the first semiconductor layer is insufficient. If the thickness of the second dielectric layer is larger than approximately 20 nm, it takes a excessively long time to increase the dopant concentration of the second dielectric layer, which means that the specific time for performing the third step becomes excessively long. Also, if the thickness of the dielectric layer is larger than approximately 20 nm, the spaces or gaps between the semiconductor grains tend to be partially or fully filled with the dielectric layer and consequently, the dopant becomes difficult to be introduced into the grains through the second dielectric layer.

In still another preferred embodiment of the method according to the present invention, the first to third steps are carried out using a same chemical vapor deposition (CVD) apparatus.

In this embodiment, there are an additional advantage that the first to third steps can be performed simply and efficiently.

In a further embodiment of the method according to the present invention, the first semiconductor layer and the semiconductor grains are made of Si, and the second step is carried out in such a way that the grains have an approximately hemispherical shape.

In this embodiment, the advantages of the present invention are remarkably exhibited.

In a still further embodiment of the method according to the present invention, a step of forming a capacitor dielectric of a memory cell capacitor on the surface of the first semiconductor layer in contact with the semiconductor grains is additionally provided after the third step, and a step of forming a second semiconductor layer on the capacitor dielectric is further provided. The first and second semiconductor layers serve as bottom and top electrodes of the memory cell capacitor, respectively.

In this embodiment, there is an additional advantage that a memory cell capacitor with a satisfactorily high capacitance is fabricated while protecting logic circuits incorporated into a semiconductor memory device from the heat applied in the third steps.

BRIEF DESCRIPTION OF THE DRAWINGS

In order that the present invention may be readily carried into effect, it will now be described with reference to the accompanying drawings.

FIG. 7 is a graph showing the relationships between the capacitance ratio $C_{min}/C_{max}$ and the diffusion time or annealing time in the method according to the first embodiment of the present invention and the conventional method, respectively.

FIG. 10 is a graph showing the relationship between the thickness of the $SiO_2$ layer and the diffusion time in the methods according to the first and second embodiments of the present invention.

DETAILED DESCRIPTION OF THE PREFERRED EMBODIMENTS

Figure 1A:
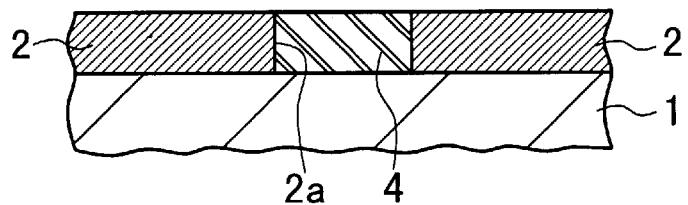
FIGS. 1A to 1E are schematic partial cross-sectional views showing the process steps of a fabrication method of a semiconductor device according to a first embodiment of the present invention, respectively.

Preferred embodiments of the present invention will be described in detail below while referring to the drawings attached.

First Embodiment

A fabrication method of a semiconductor device according to a first embodiment of the present invention is explained below with reference to FIGS. 1A to 1E and FIG. 2. In this embodiment, the method is applied to fabrication of a DRAM device equipped with logic circuits, each memory cell of which is comprised of a storage capacitor with a stacking structure (i.e., a stacked capacitor).

First, a silicon dioxide ($SiO_2$) layer 2 serving as an interlayer dielectric layer is formed on a single-crystal Si substrate 1 by a CVD process, i.e., by using a CVD apparatus. Then, a contact hole 2a is formed in the $SiO_2$ layer 2 to uncover a specific area of the substrate 1 by photolithography and etching processes.

Next, an amorphous Si layer (not shown) doped with phosphorus (P) is formed on the $SiO_2$ layer 2 to cover the contact hole 2a by a CVD process. Thus, the hole 2a is filled with the amorphous Si layer thus formed. This amorphous Si layer is then etched back until the underlying $SiO_2$ layer 2 is uncovered, thereby selectively leaving the amorphous Si layer in the hole 2. The amorphous Si layer thus left in the hole 2 serves as a contact plug 4 which is contacted with the substrate 1.

Instead of the P-doped amorphous Si layer for the contact plug 4, a P-doped polysilicon layer may be used here.

Figure 2:
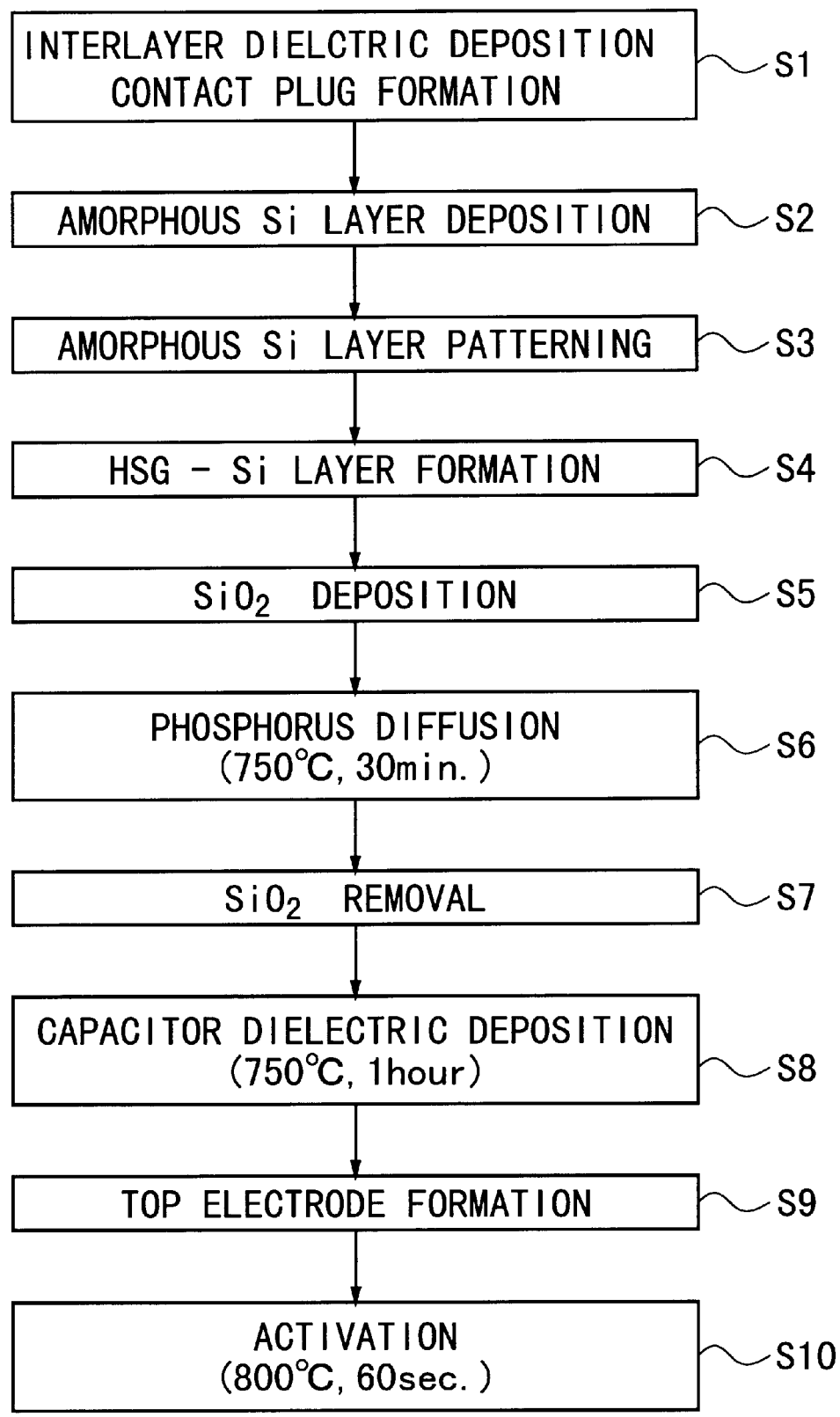
FIG. 2 is a flow chart showing the process steps of the fabrication method of a semiconductor device according to the first embodiment of the present invention.

The above processes correspond the step S1 in FIG. 2.

Subsequently, the substrate 1 with the interlayer dielectric layer 2 and the contact plug 4 is subjected to a heat treatment at a specific temperature in an atmosphere containing a gaseous Si source and a gaseous P source. Gaseous silane ($SiH_4$) or gaseous disilane ($Si_2H_6$) is preferably used as the Si source. Gaseous phosphine ($PH_3$) is preferably used as the P source. Thus, a P-doped amorphous Si layer 5 with a thickness of approximately 5 nm to 20 nm is formed on the interlayer dielectric layer 2. The P-doped amorphous Si layer 5 is contacted with the top of the amorphous Si contact plug 4 buried in the contact hole 2a of the layer 2.

An undoped amorphous Si layer or an amorphous Si layer doped with a dopant other than P may be used instead of the P-doped amorphous Si layer 5.

The process of forming the P-doped amorphous Si layer 5 corresponds to the step S2 in FIG. 2.

The P-doped amorphous Si layer 5 thus formed is then patterned by a conventional photolithography and etching processes to have a specific shape (e.g., a cylindrical shape) of a bottom electrode of the stacked capacitor. The patterned amorphous Si layer 5 is contacted with the top of the contact plug 4 in the hole 2a of the $SiO_2$ layer 2. The structure at this stage is shown in FIG. 1B.

The process of patterning the P-doped amorphous Si layer corresponds to the step S3 in FIG. 2.

After removing the contamination and the unwanted native $SiO_2$ produced on the uncovered surface of the patterned amorphous Si layer 5 (i.e., the bottom electrode of the capacitor), the substrate 1 with the patterned amorphous Si layer 5 is subjected to a heat treatment at a temperature of approximately 540 to 630° C. in an atmosphere containing a gaseous silane or disilane. Through this heat-treatment process, minute nuclei (not shown) of Si are randomly deposited on the whole uncovered surface of the patterned amorphous Si layer 5 and the uncovered surface of the $SiO_2$ layer 2. The Si atoms of the Si nuclei are supplied from the gaseous silane or disilane existing in the atmosphere.

Following this heat-treatment process, the substrate 1 with the Si nuclei is subjected to another heat treatment. This later heat-treatment process is carried out at the same temperature (i.e., approximately 540 to 630° C.) as that of the former heat-treatment process for depositing the Si nuclei. However, this later heat-treatment process is carried out in a vacuum atmosphere which does not contain any Si source. During this later heat-treatment process, free or disengaged Si atoms are produced by thermal decomposition of the patterned amorphous Si layer 5 and then, the disengaged Si atoms thus produced diffuse on or near the surface of the Si layer 5 toward the individual Si nuclei existing on the surface of the Si layer 5. Thus, the Si nuclei grow up to result in amorphous Si grains 5a on the surface of the Si layer 5.

Figure 1B:
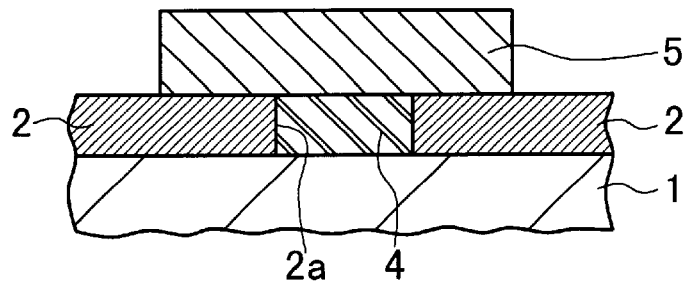
Figure 1C:
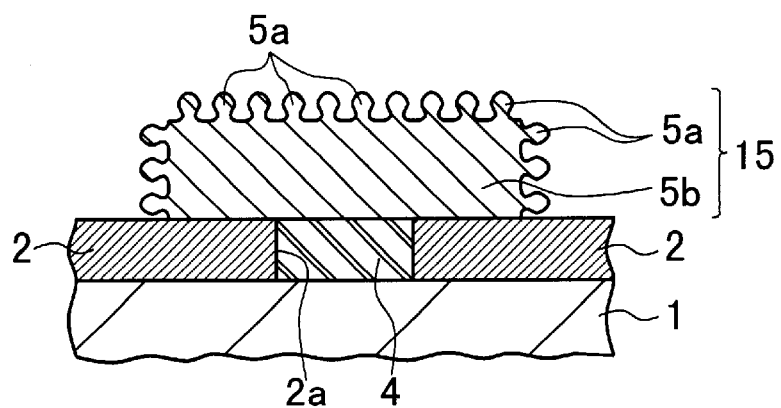

The structure at this stage is shown in FIG. 1C.

Since the amorphous Si grains 5a thus produced usually have a hemispherical shape, the patterned amorphous Si layer 5 with the grains 5a on its surface is termed the "hemispherical grained (HSG)" Si layer. Therefore, the HSG Si layer is referred by a reference numeral 15. Also, the remaining part of the HSG Si layer 15 other than the Si grains 5a is termed a bulk Si region 5b.

The later heat-treatment process may be carried out in an inert atmosphere containing any inert gas such as argon (Ar) instead of the vacuum atmosphere. Moreover, that this process also may be carried out in any atmosphere that does not prevent the formation of the amorphous Si grains 5a on the surface of the Si layer 15.

The two heat treatment processes for forming the HSG Si layer 15 correspond to the step S4 in FIG. 2.

Figure 1D:
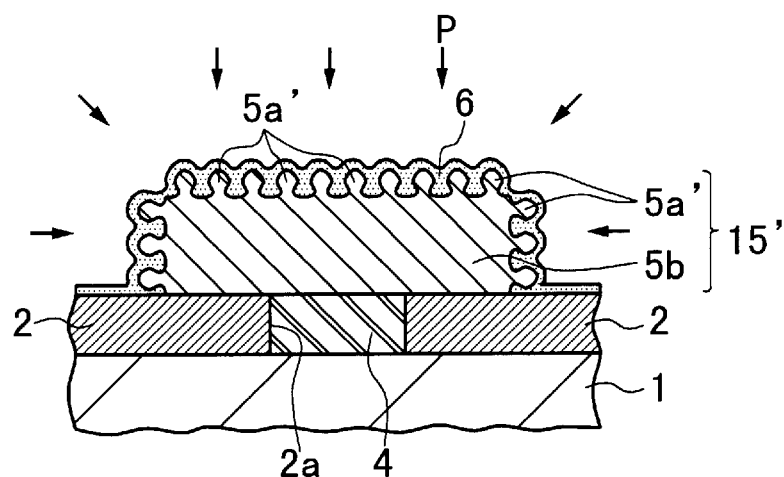
Figure 3:
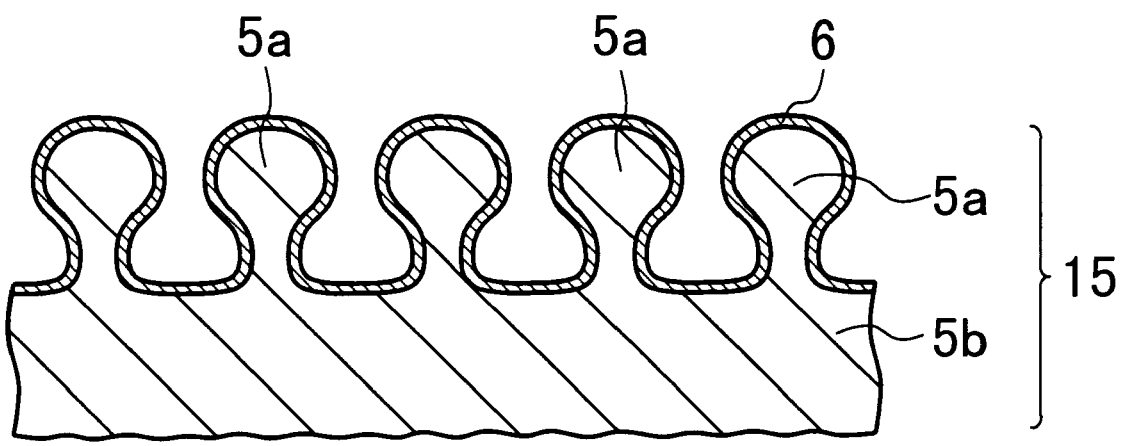
FIG. 3 is a schematic enlarged partial cross-sectional view showing the structure of the silicon layer with the HSG configuration and the $SiO_2$ layer formed thereon fabricated in the method according to the first embodiment of the present invention.

Subsequently, as shown in FIG. 1D, an undoped $SiO_2$ layer 6 is formed to cover the HSG Si layer 15 by a CVD process. The thickness of the $SiO_2$ layer 6 is set as approximately 100 Å so as not to fill the spaces or gaps between the grains 5a, as clearly shown in FIG. 3.

This CVD process for forming the undoped $SiO_2$ layer 6 corresponds to the step S5 in FIG. 2.

Following this CVD process, the substrate 1 with the undoped $SiO_2$ layer 6 is subjected to a heat treatment in an atmosphere containing gaseous phosphoryl chloride ($POCl_3$) at a temperature of approximately 750° C. for approximately 30 minutes. The pressure of the atmosphere is set at a suitable value such as 0.1 Torr to several thousands Torr. Through this heat treatment process, the P atoms present in the atmosphere are doped into the undoped $SiO_2$ layer 6 in gas phase until a specific allowable dopant concentration according to the heat-treatment temperature and at the same time, the HSG Si layer 15 is thermally oxidized to increase the thickness of the SiO$_2$ layer 6. The P atoms doped into the SiO$_2$ layer 6 are further diffused into the HSG Si layer 15 in solid phase.

Since POCl$_3$ is liquid at a room temperature, POCl$_3$ is vaporized due to bubbling by the use of nitrogen (N$_2$) gas to produce the gaseous POCl$_3$. Then, the gaseous POCl$_3$ thus produced is mixed with an oxygen (O$_2$) gas supplied to a reaction chamber (not shown) of the CVD apparatus, resulting in the P atoms as the dopant.

The P atoms thus doped are not distributed in the whole HSG Si layer 15 but distributed in only the surface regions (i.e., the grains 5a) of the layer 15 along its top and side faces. The Si grains 5a doped with the P atoms are referred as 5a', and the HSG Si layer 15 equipped with the P-doped Si grains 5a' is referred as 15', as shown in FIG. 1D.

The heat-treatment process for doping the P atoms in the POCl$_3$-containing atmosphere corresponds to the step S6 in FIG. 2.

In this heat-treatment process, the P atoms serving as the dopant are continuously supplied to the SiO$_2$ layer 6 from the gaseous POCl$_3$ contained in the atmosphere during this heat treatment process. Therefore, the P concentration of the SiO$_2$ layer 6 does not decrease with time (i.e., the progress of this heat-treatment process). This means that the P atoms are stably doped into the undoped grains 15a of the HSG Si layer 15.

Also, because the SiO$_2$ layer 6 serves as a buffer layer for suppressing the combination of the Si atoms existing in the HSG Si layer 15 with oxygen (O) atoms, the Si atoms in the Si layer 15 are suppressed to be consumed due to thermal oxidation.

As a result, the patterned P-doped HSG Si layer 15' provides desired characteristics of the bottom electrode of a stacked capacitor of the DRAM device.

To ensure the capacitance of the stacked capacitor as high as possible, the P-doped Si grains 5a' are located on the whole uncovered surface (i.e., whole top and side faces) of the HSG Si layer 15', as shown in FIG. 1D.

Since the SiO$_2$ layer 6 suppresses the Si grains 5a to shrink due to oxidation, the initial expanded surface area of the HSG Si layer 15' is maintained substantially unchanged. Accordingly, an obtainable value of the capacitance is increased according to the surface area increase of the HSG layer 15' while maintaining the initial mechanical strength of the Si grains 5a'.

It is preferred that the heat-treatment temperature in the POCl$_3$-containing atmosphere is set at approximately 700° C. to 780° C. and that the heat-treatment time in the same atmosphere is set at approximately 10 minutes to 120 minutes.

Moreover, the P-doped SiO$_2$ layer 6, which has grown through the phosphorus doping process, is removed from the surface of the HSG Si layer 15' by a dry etching process, thereby exposing the whole roughened surface of the HSG Si layer 15' and the whole surface of the SiO$_2$ layer 2.

This etching process corresponds to the step S7 in FIG. 2.

Figure 1E:
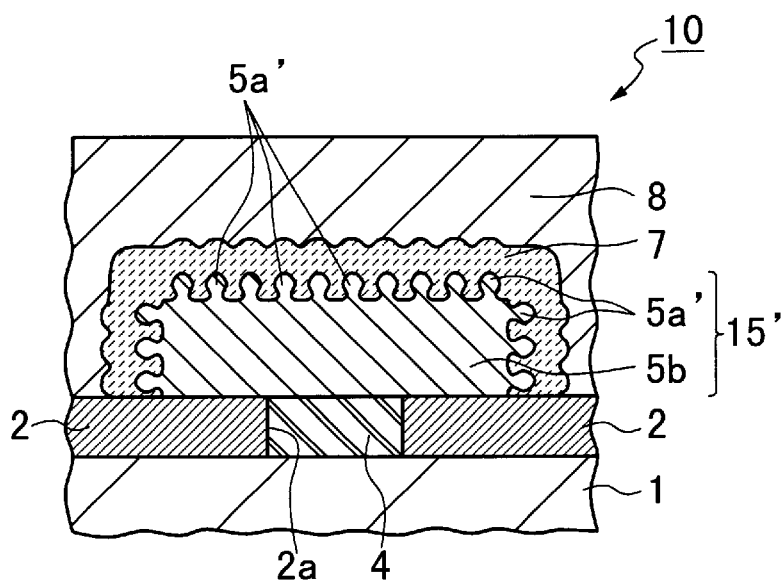

A dielectric layer 7 such as a silicon nitride (Si$_3$N$_4$) layer is selectively formed on the surface of the HSG Si layer 15' by a CVD process in such a way that the layer 7 is contacted with the P-doped Si grains 5a' of the layer 15', as shown in FIG. 1E. The dielectric layer 7 serves as a capacitor dielectric of the stacked capacitor. For example, this CVD process is carried out in a specific atmosphere containing a gaseous source of the dielectric layer 7 at a temperature of approximately 750° C. for approximately one hour.

This CVD process corresponds to the step S8 in FIG. 2.

Actually, the dielectric layer 7 is much thinner than that shown in FIG. 1E. However, the dielectric layer 7 is illustrated to have a larger thickness than the actual one for facilitating the understanding in FIG. 1E.

A P-doped amorphous Si layer 8 is formed to cover the dielectric layer 7 by a known process, as shown in FIG. 1E. The amorphous Si layer 8 serves as a top electrode of the capacitor.

This process for the P-doped amorphous Si layer 8 corresponds to the step S9 in FIG. 2.

Finally, the P-doped amorphous Si layer 8 serving as the top electrode is heat-treated in a nitrogen (N$_2$) atmosphere at a temperature of approximately 800° C. for approximately 60 seconds. Thus, the P-doped amorphous Si layer 8 is electrically activated. Since this heat-treatment process is carried out in a short time of approximately 60 seconds, the electronic elements such as transistors incorporated into the DRAM device are not adversely affected by the applied heat.

This process for heat-treating the P-doped amorphous Si layer 8 corresponds to the step S10 in FIG. 2.

With the fabrication method of the semiconductor device 1 according to the first embodiment of the present invention, as described above, after the Si grains Sa are formed on the surface of the P-doped amorphous Si layer 15, the P atoms serving as the dopant are introduced into the grains 5a of the layer 15 from the atmosphere containing the gaseous P dopant. Therefore, although the heat-treatment process of introducing the P dopant is carried out at a comparatively low temperature of approximately 700° C. to 780° C., the P dopant can be suitably doped into the grains 5a of the layer 15 as desired.

Moreover, since the heat-treatment process of introducing the P dopant is carried out at a comparatively low temperature of approximately 700° C. to 780° C., the P dopant can be introduced into the surface-roughened amorphous Si layer 15 while protecting logic circuits incorporated into the DRAM device from the heat applied in this heat-treatment process.

Additionally, due to existence of the SiO$_2$ layer 6, the amorphous Si layer 15 with the Si grains 5a is suppressed to be thermally oxidized in the heat-treatment process of introducing the P dopant. Accordingly, there is an additional advantage that the surface-roughness decrease of the amorphous Si layer 15' with the P-doped Si grains 5a' is suppressed in this heat-treatment process.

Also, since the P dopant is introduced from the atmosphere, there is another additional advantage that the SiO$_2$ layer 6 may be formed as thin as possible and as a result, the layer 6 is readily removed.

To confirm the advantages of the fabrication method according to the present invention, the inventor carried out some tests. The results of the tests are explained below.

Figure 4:
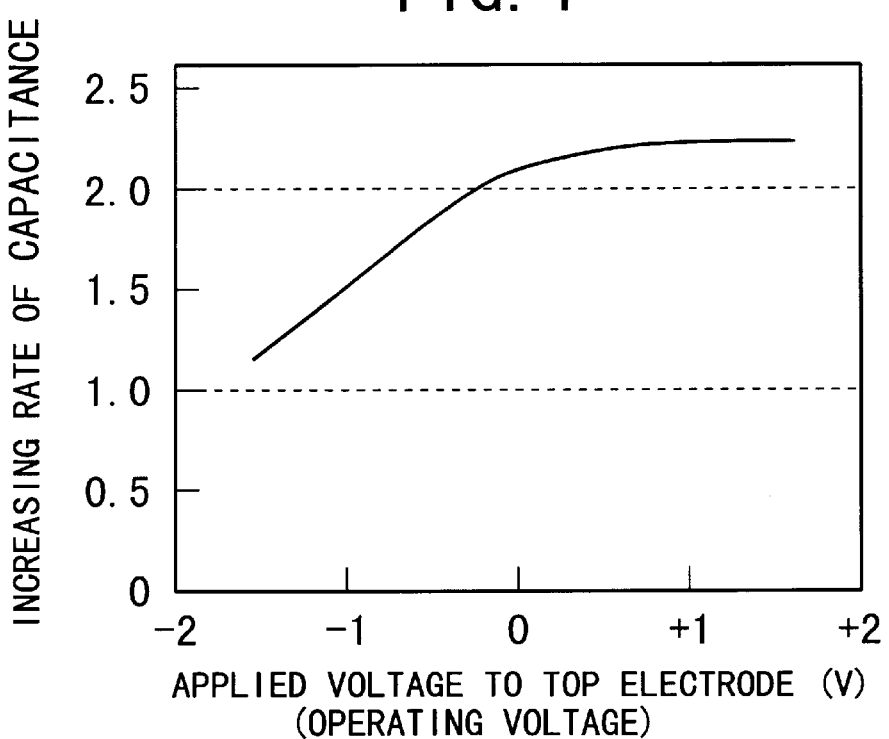
FIG. 4 is a graph showing the relationship between the capacitance increasing rate and the applied voltage to the top electrode of a capacitor fabricated by a conventional method.

FIG. 4 shows the relationship between the increasing rate of the capacitance and the applied voltage (i.e., the operating voltage) to the top electrode of a stacked capacitor fabricated by the prior-art method disclosed in the Japanese Non-Examined Patent Publication No. 9-289292, in which the P dopant was introduced into a HSG Si layer from a PSG layer in solid phase in the same heat-treatment condition (750° C., 30 minutes) as that of the first embodiment according to the invention.

The increasing rate of the capacitance was defined as a ratio of the capacitance value where the Si grains are formed with respect to the capacitance value where the Si grains are not formed. The electric potential of the bottom electrode was set as zero (0) V.

As seen from FIG. 4, when the applied voltage is approximately equal to approximately −1 V or lower, the increasing rate is comparatively low. This means that the HSG Si layer 15' served as the bottom electrode 15' insufficiently, which was due to insufficient introduction of the P dopant.

The increasing rate of the capacitance is approximately 1.2 at the applied voltage of approximately −1.7 V. The increasing rate of the capacitance is approximately 2.2 at the applied voltage of approximately +1.7 V. Thus, it is seen from FIG. 4 that the increasing rate of the capacitance changes in a wide range according to the change of the applied voltage and that the capacitance characteristic is not stable.

Figure 5:
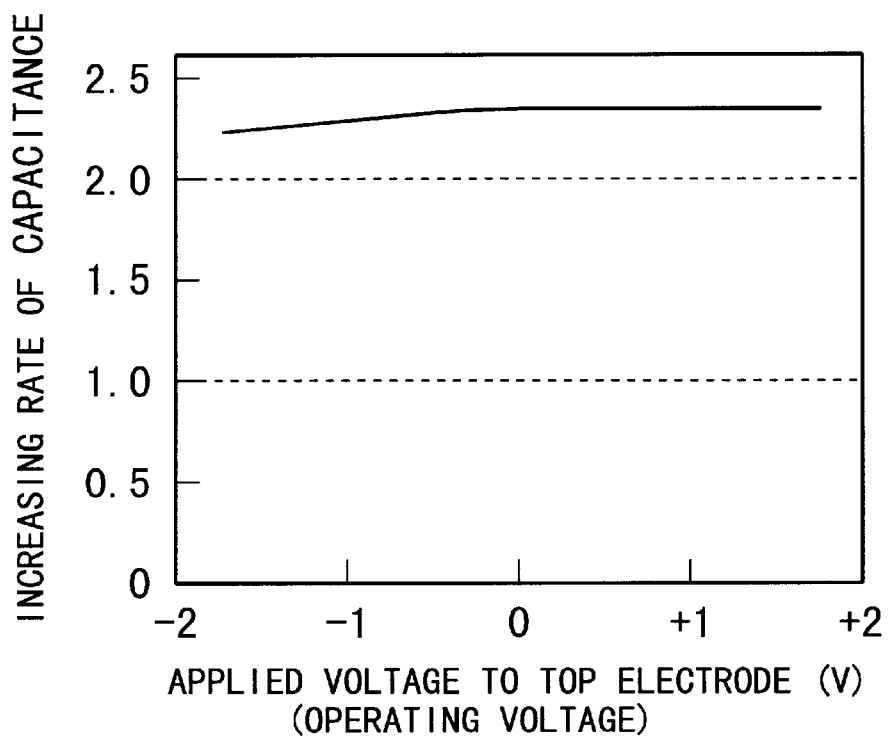
FIG. 5 is a graph showing the relationship between the capacitance increasing rate and the applied voltage to the top electrode of the capacitor fabricated by the method according to the first embodiment of the present invention.

On the other hand, the relationship between the increasing rate of the capacitance and the applied voltage to the top electrode of the stacked capacitor in the above-described fabrication method according to the first embodiment is shown in FIG. 5.

As seen from FIG. 5, the increasing rate of the capacitance is approximately 2.2 at the applied voltage of approximately −1.7 V and approximately 2.3 at the applied voltage of approximately +1.7 V. Thus, compared with the result of the conventional method shown in FIG. 4, the increasing rate of the capacitance changes in a narrow range according to the change of the applied voltage, and the capacitance characteristic is very stable in the method according to the first embodiment. This means that the HSG Si layer 15' was sufficiently doped with the P dopant, and served as the bottom electrode 15' sufficiently.

Figure 6:
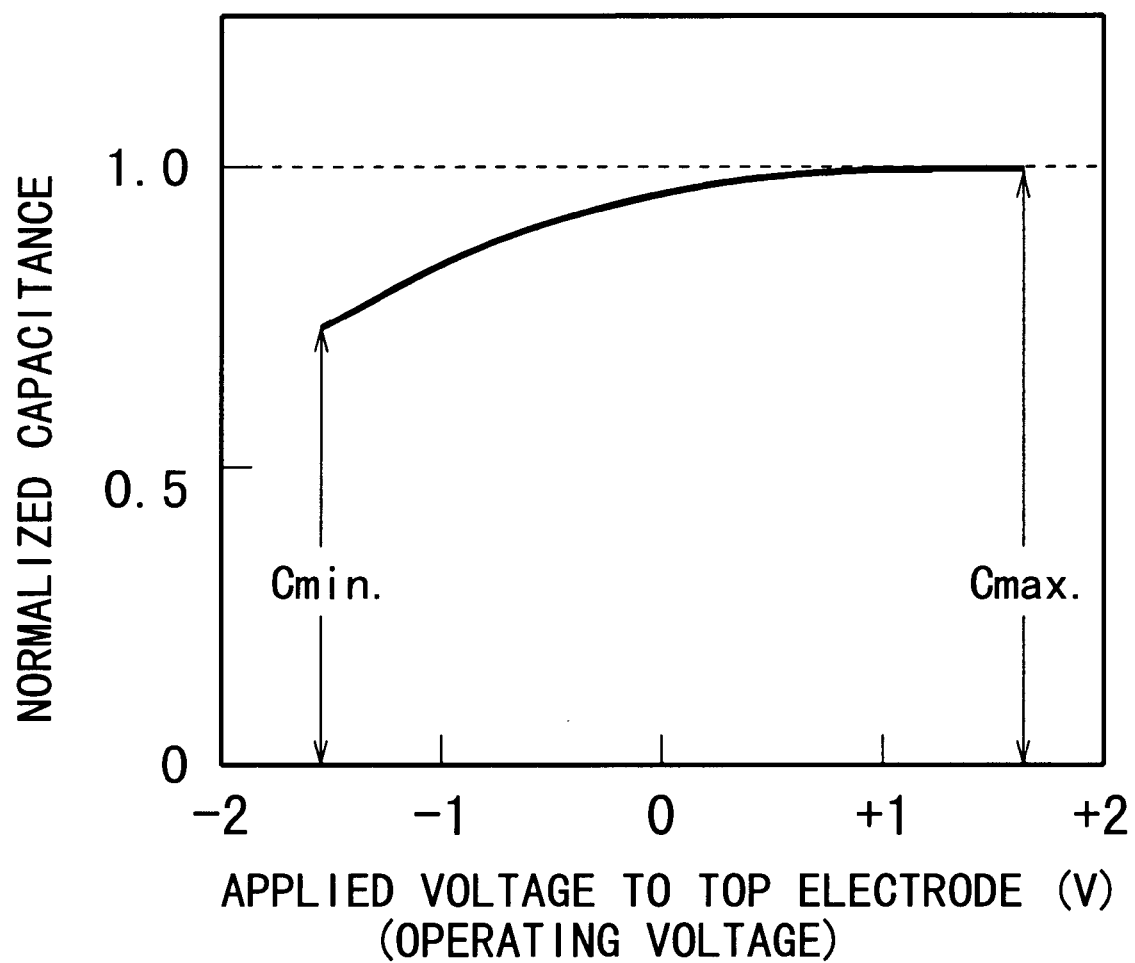
FIG. 6 is a graph showing the relationship between the normalized capacitance and the applied voltage to the top electrode of the capacitor.

FIG. 6 shows the relationship of the normalized capacitance by the maximum capacitance value $C_{max}$ with the voltage applied to the top electrode. FIG. 6 is shown to explain the meaning of the ratio ($C_{min}/C_{max}$) (%) of the minimum capacitance value $C_{min}$ to the maximum capacitance value $C_{max}$, which is a criterion to evaluate the performance of the capacitor.

It is preferred that the value of the ratio ($C_{min}/C_{max}$) is as large as possible, the reason of which is as follows. If the value of ($C_{min}/C_{max}$) is large, the capacitance change with respect to the applied voltage is small and the bottom electrode serves sufficiently even at a low applied voltage. This means that the capacitance characteristic is good.

FIG. 7 shows the relationships between the capacitance ratio ($C_{min}/C_{max}$) and the diffusion time or annealing time in the method according to the first embodiment of the present invention and the conventional method, respectively.

In FIG. 7, the curve A1 denotes the change of ($C_{min}/C_{max}$) with respect to the diffusion time in the fabrication method according to the first embodiment of the present invention, the curve A2 denotes the change of ($C_{min}/C_{max}$) with respect to the annealing time in the prior-art method as previously referred to FIG. 4.

As seen from FIG. 7, the capacitance ratio ($C_{min}/C_{max}$) (A1) in the method according to the first embodiment increases at a higher rate than that (A2) of the prior-art method with the diffusion or annealing time, respectively. This means that the P dopant was introduced into the HSG Si layer 15 even at the low heat-treatment temperature (i.e., low doping temperature) in the first embodiment in the practically short time. In other words, the P dopant was introduced into the HSG Si layer 15 more efficiently than that of the prior-art method.

Second Embodiment

Figure 8A:
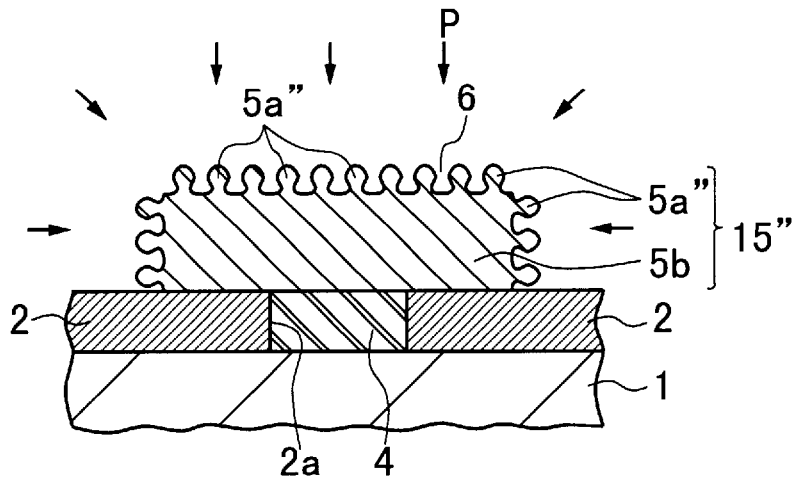
FIGS. 8A and 8B are schematic partial cross-sectional views showing the process steps of a fabrication method of a semiconductor device according to a second embodiment of the present invention, respectively.
Figure 8B:
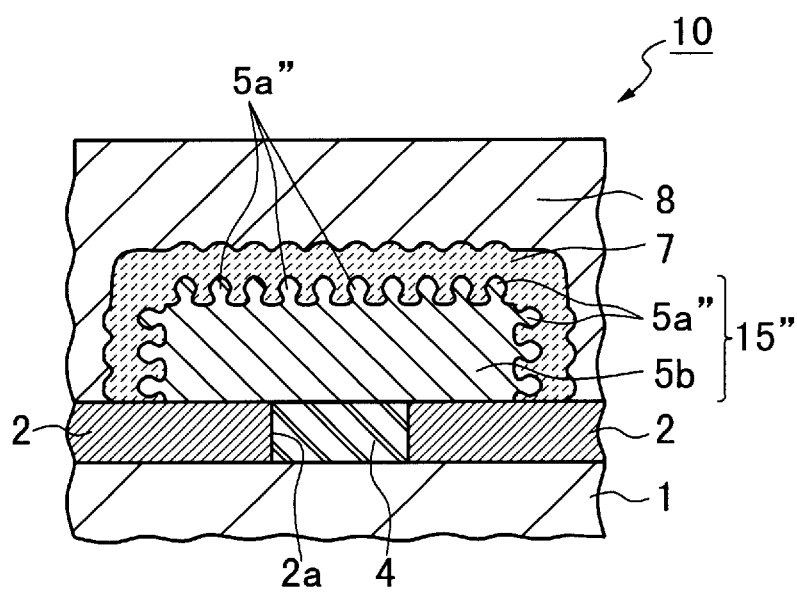

FIGS. 8A and 8B show a fabrication method of a semiconductor device according to a second embodiment of the present invention, which has the same process steps as those in the first embodiment except that only the step S5 of depositing the $SiO_2$ layer 6 by a CVD process is omitted.

Specifically, in the method according to the second embodiment, after the steps S1 to S4 used in the method according to the first embodiment (which are shown in FIGS. 1A to 1C) are carried out, the step S6 of doping the P atoms is carried out by heat-treating the substrate 1 in the same condition as that of the first embodiment. Since the $SiO_2$ layer 6 is not formed, the P atoms contained in the atmosphere are directly diffused in gas phase into the Si grains 5a of the HSG Si layer 15 shown in FIG. 1C, resulting in P-doped Si grains 15a". The HSG Si layer 15 with the P-doped Si grains 15a" is referred as 15". The state at this stage is shown in FIG. 8A.

Since the P dopant is continuously supplied to the undoped Si grains 5a from the gaseous $POCl_3$ contained in the atmosphere during the step S6, the P concentration in the neighborhood of the Si grains 5a does not decrease with time (i.e., the progress of this process). This means that the P atoms are stably doped into the grains 5a of the HSG Si layer 15.

Unlike the first embodiment, since the $SiO_2$ layer 6 is not provided, the Si atoms existing in the HSG Si layer 15 are readily oxidized during the heat-treatment process of doping the P atoms compared with the method according to the first embodiment. Therefore, the Si atoms existing in the Si layer 15 are likely to be consumed due to oxidation during this process, thereby decreasing slightly the size of the P-doped Si grains 5a" and the initial expanded surface area of the HSG Si layer 15". However, no problem occurs by suitably setting the heat-treatment condition.

Through the P doping process, the HSG Si layer 15 is thermally oxidized to form an unwanted $SiO_2$ layer (not shown) to cover the P-doped Si grains 5a" of the Si layer 15".

Subsequently, the unwanted $SiO_2$ layer, which has grown through the phosphorus doping process, is removed from the surface of the HSG Si layer 15" by a dry etching process, thereby exposing the whole roughened surface of the HSG Si layer 15" (step S7).

Following the process of removing the unwanted $SiO_2$ layer (Step S7), a dielectric layer 7 serving as the capacitor dielectric is selectively formed on the surface of the HSG Si layer 15" by a CVD process, as shown in FIG. 8B (step S8). Further, a P-doped amorphous Si layer 8 serving as the top electrode is formed to cover the capacitor dielectric 7 by a known process, as shown in FIG. 8B (step S9). Finally, a P-doped amorphous Si layer 8 is heat-treated for activation (step S10).

With the fabrication method of the semiconductor device 1 according to the second embodiment of the present invention, since substantially the same process steps as those in the first embodiment are carried out, it is obvious that there are the same advantage as those in the first embodiment.

Figure 9:
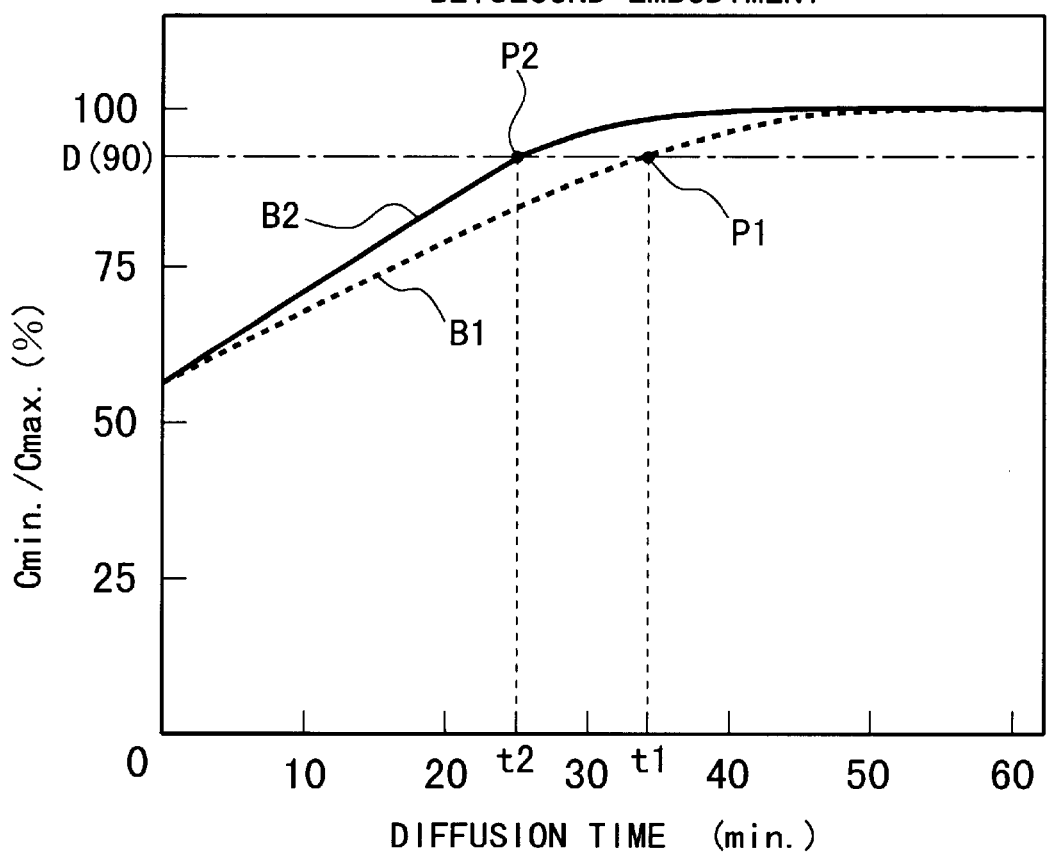
FIG. 9 is a graph showing the relationship between the capacitance ratio $C_{min}/C_{max}$ and the diffusion time in the methods according to the first and second embodiments of the present invention.

FIG. 9 shows the relationship between the capacitance ratio ($C_{min}/C_{max}$) and the diffusion time in the methods according to the first and second embodiments of the present invention, in which the character D denotes a desired reference value of ($C_{min}/C_{max}$) to be evaluated as good. Here, desired reference value was set as 90%.

As seen from the curve B2 in FIG. 9, the capacitance ratio ($C_{min}/C_{max}$) excesses the reference value D at the diffusion time of about 23 minutes (i.e., at the time t2) to increase up to 100% and then, it has a same value of 100% after the time t2 in the method according to the second embodiment. On the other hand, in the method according to the first embodiment, as seen from the curve B1 in FIG. 9, the capacitance ratio ($C_{min}/C_{max}$) excesses the reference value D at the diffusion time of about 34 minutes (i.e., at the time t1) to increase up to 100% and then, it has a same value of 100% after the time t1.

As a result, it is seen that it takes a slightly longer diffusion time in the method according to the first embodiment than that of the method according to the second embodiment until the capacitance ratio ($C_{min}/C_{max}$) excesses the reference value D. This is due to the existence of the $SiO_2$ layer 6 located on the surface grains 5a of the HSG Si layer 15. Moreover, it is seen that a desired good value of ($C_{min}/C_{max}$) can be realized in the methods according to the first and second embodiments by adjusting the diffusion time of the P dopant.

FIG. 10 shows the thickness change of the $SiO_2$ layer formed on the HSG Si layer 15 with respect to the diffusion time in the methods according to the first and second embodiments of the present invention.

As seen from the curve B1' in FIG. 10, in the method according to the first embodiment, the thickness of the $SiO_2$ layer 6 was increased from its initial thickness of 100 Å to 135 Å at the time t1 where the capacitance ratio ($C_{min}/C_{max}$) excesses the reference value D. In other words, the $SiO_2$ layer 6 grew from 100 Å to 135 Å from the start to the time t1. Therefore, the thickness increase of the $SiO_2$ layer 6 is suppressed to 35 Å (=135 Å−100 Å), which is due to the $SiO_2$ layer 6 existing at the start of the process.

On the other hand, in the method according to the second embodiment, as seen from the curve B2' in FIG. 10, the thickness of the unwanted $SiO_2$ layer was increased from zero to 110 Å at the time t2 (which is earlier than the time t1) where the capacitance ratio ($C_{min}/C_{max}$) excesses the reference value D. This means that the consumption amount of the Si atoms in the Si layer 15 in the second embodiment is slightly larger than that in the first embodiment. However, approximately the same advantages as those in the first embodiment are obtained in the second embodiment by suitably setting the heat-treatment condition.

In the above-described first and second embodiments, the present invention is applied to fabrication of a DRAM device. However, it is needless to say that the present invention may be applied to fabrication of any other semiconductor device than a DRAM device if it is equipped with a capacitor.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device, comprising:
   (a) a first step of forming a first semiconductor layer over a semiconductor substrate through a first dielectric;
   (b) a second step comprising a first heat-treating step of heat-treating said first semiconductor layer to form semiconductor grains on a surface of said first semiconductor layer, thereby roughening said surface of said first semiconductor layer;
       said grains being made of a same material as that of said first semiconductor layer; and
   (c) a third step comprising a second heat-treating step of heat-treating said first semiconductor layer with said semiconductor grains at a temperature of approximately 700° C. to 780° C. for a specific time in an atmosphere containing a gaseous dopant, thereby introducing said dopant into said semiconductor grains of said first semiconductor layer from said atmosphere.

2. The method as claimed in claim 1, wherein said specific time in said third step is approximately 10 minutes to 120 minutes.

3. The method as claimed in claim 1, further comprising:
   (d) a step of forming a second dielectric layer between said second and third steps;
       said second dielectric layer being not doped with any dopant, and said dopant being introduced into said semiconductor grains of said first semiconductor layer through said second dielectric layer in said third step; and
   (e) a step of removing said second dielectric layer after said third step.

4. The method as claimed in claim 3, wherein said second dielectric layer has a thickness of approximately 5 nm to 20 nm.

5. The method as claimed in claim 1, wherein said first to third steps are carried out using a same CVD apparatus.

6. The method as claimed in claim 1, wherein said first semiconductor layer and said semiconductor grains are made of Si, and said second step is carried out in such a way that said grains have an approximately hemispherical shape.

7. The method as claimed in claim 1, further comprising:
   (f) a step of forming a capacitor dielectric of a memory cell capacitor on said surface of said first semiconductor layer in contact with said semiconductor grains after said third step; and
   (g) a step of forming a second semiconductor layer on said capacitor dielectric;
       wherein said first and second semiconductor layers serve as bottom and top electrodes of a memory cell capacitor, respectively.

8. The method as claimed in claim 1, wherein said semiconductor grains are located on said whole uncovered surface of said first semiconductor layer.

9. The method as claimed in claim 1, wherein said second step is comprised of:
   a first substep of heat-treating said first semiconductor layer in an atmosphere containing a gaseous source of a same semiconductor material as that of said first semiconductor layer, thereby depositing nuclei of said source; and
   a second substep of heat-treating said first semiconductor layer in an atmosphere excluding said gaseous source, thereby growing said nuclei to form said semiconductor grains on said surface of said first semiconductor layer.

10. The method as claimed in claim 9, wherein said atmosphere in said first substep contains silane or disilane as said gaseous source.

11. The method as claimed in claim 1, wherein said atmosphere in said third step contains phosphoryl chloride as said gaseous dopant.

* * * * *